United States Patent
Setoyama et al.

(10) Patent No.: US 8,871,340 B2
(45) Date of Patent: Oct. 28, 2014

(54) SURFACE-COATED SINTERED BODY

(75) Inventors: Makoto Setoyama, Itami (JP); Katsumi Okamura, Itami (JP); Nozomi Tsukihara, Itami (JP)

(73) Assignee: Sumitomo Electric Hardmetal Corp., Itami-shi (JP)

( * ) Notice: Subject to any disclaimer, the term of this patent is extended or adjusted under 35 U.S.C. 154(b) by 287 days.

(21) Appl. No.: 13/502,033

(22) PCT Filed: Jun. 1, 2011

(86) PCT No.: PCT/JP2011/062595
§ 371 (c)(1),
(2), (4) Date: Apr. 13, 2012

(87) PCT Pub. No.: WO2012/056758
PCT Pub. Date: May 3, 2012

(65) Prior Publication Data
US 2012/0282050 A1 Nov. 8, 2012

(30) Foreign Application Priority Data

Oct. 28, 2010 (JP) ................................ 2010-241940

(51) Int. Cl.
| | | |
|---|---|---|
| C04B 41/52 | (2006.01) | |
| C23C 30/00 | (2006.01) | |
| C04B 41/90 | (2006.01) | |
| C04B 35/5831 | (2006.01) | |
| C22C 26/00 | (2006.01) | |
| C04B 41/00 | (2006.01) | |
| C04B 35/645 | (2006.01) | |
| C23C 28/04 | (2006.01) | |
| B22F 5/00 | (2006.01) | |

(52) U.S. Cl.
CPC ....... *C04B 35/5831* (2013.01); *B22F 2005/001* (2013.01); *C04B 2235/3839* (2013.01); *C04B 2235/3886* (2013.01); *C23C 30/005* (2013.01); C04B 2235/3847 (2013.01); C04B 2235/3856 (2013.01); *C04B 41/90* (2013.01); C04B 2235/405 (2013.01); C04B 2235/422 (2013.01); *C04B 41/52* (2013.01); C04B 2235/428 (2013.01); C04B 2235/3865 (2013.01); C04B 2235/80 (2013.01); C04B 2235/3873 (2013.01); C04B 2235/3217 (2013.01); C04B 2235/3813 (2013.01); C04B 2235/404 (2013.01); C04B 2235/656 (2013.01); *C22C 26/00* (2013.01); *C04B 41/009* (2013.01); C04B 2235/3843 (2013.01); C04B 2235/421 (2013.01); *C04B 35/645* (2013.01); *C23C 28/04* (2013.01); C04B 2235/3804 (2013.01); C04B 2235/402 (2013.01)

USPC .............. 428/325; 51/307; 51/309; 428/336; 428/469; 428/472; 428/697; 428/698; 428/699; 428/704

(58) Field of Classification Search
CPC ................. B22F 2005/001; C04B 2235/3813; C04B 2235/3839; C04B 2235/3856; C04B 2235/3886; C04B 35/5831; C04B 41/52; C04B 41/90; C22C 26/00; C23C 28/04; C23C 30/005
USPC ............ 51/307, 309; 428/325, 336, 469, 472, 428/697, 698, 699, 704
See application file for complete search history.

(56) References Cited

U.S. PATENT DOCUMENTS

| | | | |
|---|---|---|---|
| 5,188,643 A | 2/1993 | Iacovangelo | |
| 6,620,491 B2 * | 9/2003 | Kukino et al. | 428/697 |
| 6,623,850 B2 * | 9/2003 | Kukino et al. | 428/336 |
| 7,226,670 B2 * | 6/2007 | Derflinger et al. | 51/307 |
| 7,960,015 B2 * | 6/2011 | Lechthaler et al. | 428/698 |
| 8,304,098 B2 * | 11/2012 | Kubota et al. | 428/699 |
| 2002/0045072 A1 | 4/2002 | Kukino et al. | |

FOREIGN PATENT DOCUMENTS

| | | |
|---|---|---|
| CA | 2 356 039 A1 | 2/2002 |
| JP | 5-195267 A | 8/1993 |
| JP | 6-079503 A | 3/1994 |
| JP | 2000-129423 A | 5/2000 |
| JP | 2002-144110 A | 5/2002 |
| JP | 2005-047004 A | 2/2005 |
| JP | 2005-330540 A | 12/2005 |

OTHER PUBLICATIONS

Office Action in Canadian Patent Application No. 2,774,665, dated Jul. 23, 2013.

* cited by examiner

*Primary Examiner* — Archer Turner
(74) *Attorney, Agent, or Firm* — Venable LLP; Michael A. Sartori; George L. Howarah

(57) ABSTRACT

There is provided a surface-coated sintered body formed of a sintered body of cubic boron nitride with a sufficiently adhesive surface coating layer thereon. The present surface-coated sintered body includes a sintered body of cubic boron nitride and a surface coating layer formed on a surface thereof, the sintered body of cubic boron nitride including 20-99.5% by volume of cubic boron nitride and a binder, the surface coating layer including an adhesion layer and at least one hard coating layer, the adhesion layer being a metal layer including at least W, and being formed to cover a surface of the sintered body of cubic boron nitride, the hard coating layer being formed to coat the adhesion layer, the adhesion layer being configured of an amorphous state and/or ultrafine particles having an average particle size equal to or smaller than 5 nm.

10 Claims, No Drawings

SURFACE-COATED SINTERED BODY

TECHNICAL FIELD

The present invention relates to a surface-coated sintered body including a sintered body of cubic boron nitride and a surface coating layer formed on a surface thereof.

BACKGROUND ART

Conventionally, a sintered body of cubic boron nitride has large hardness, and accordingly, it has been widely used as a material for tools, such as cutting tools. Furthermore, it is also known to form a surface coating layer on a surface of a sintered body of cubic boron nitride for improved wear-resistance and the like.

For example, Japanese Patent Laying-Open No. 2005-047004 (Patent Literature 1) discloses a composite large hardness material for a tool that is a sintered body of cubic boron nitride having a surface provided with an intermediate layer formed of a compound of a nitride, carbide or the like of group 4a, 5a, and 6a elements, and a coating of TiAlN or the like on the intermediate layer. Furthermore, Japanese Patent Laying-Open No. 2002-144110 (Patent Literature 2) discloses a tool of a surface-coated sintered body of boron nitride that is formed of a sintered body of boron nitride having a surface provided with an intermediate layer formed of at least one element selected from group 4a, 5a, and 6a elements, and a hard coating layer on the intermediate layer. Furthermore, Japanese Patent Laying-Open No. 2000-129423 (Patent Literature 3) discloses a hard coating formed of a first layer formed on a substrate and formed of metal of groups 4a, 5a, 6a, and a second layer formed on the first layer and formed of TiAlVN or the like.

CITATION LIST

Patent Literature

PTL 1: Japanese Patent Laying-Open No. 2005-047004
PTL 2: Japanese Patent Laying-Open No. 2002-144110
PTL 3: Japanese Patent Laying-Open No. 2000-129423

SUMMARY OF INVENTION

Technical Problem

When a hard coating layer is formed on a sintered body of cubic boron nitride, the hard coating layer shows a tendency inferior in toughness. In particular, when the hard coating layer receives a large impact load, a varying load or the like, the hard coating layer may exfoliate resulting in a tool having short lifetime.

Accordingly, as suggested in Patent Literature 1-3, an intermediate layer is formed between a hard coating layer and a substrate (or a sintered body of cubic boron nitride) to enhance the adhesion of the hard coating layer to the substrate.

In Patent Literature 1, the intermediate layer formed of a compound of nitride, carbide or the like of group 4a, 5a, 6a elements is considered to improve adhesion more than coating of TiAlN or the like (or hard coating). However, this compound is a metal binding compound, and accordingly, hardly forms a chemical bond with a sintered body of cubic boron nitride. Accordingly, if it receives a large impact load, a varying load or the like, it is required to have further adhesion against such loads.

Furthermore, in Patent Literature 2, the intermediate layer is configured of metal, rather than a compound as described in Patent Literature 1. This metal is diffused in both the sintered body of cubic boron nitride and the hard coating and forms a solid solution of metal boride, metal nitride, or the like in a portion having the metal diffused therein, and is thus expected to provide further enhanced adhesion than Patent Literature 1. However, such a solid solution is after all insufficient for providing a chemical bond at an interface different in bindability, such as an interface of covalently binding metal boride and metal nitride. Accordingly, if it receives a large impact load, a varying load or the like, it is required to have further adhesion against such loads.

Patent Literature 3 describes forming a metal layer as an intermediate layer, similarly as described in Patent Literature 2, for alleviated stress. Such stress alleviation is expected to be effective when a hard coating has large stress. If the hard coating per se has small stress, however, such stress alleviation is not expected to be effective. Moreover, the Patent Literature is silent on the substrate's type, and when a sintered body of cubic boron nitride is used as a substrate, it is unknown what effect is exhibited.

The present invention has been made in view of such circumstances and it contemplates a surface-coated sintered body formed of a sintered body of cubic boron nitride having a surface coating layer formed thereon and exhibiting sufficient adhesion even when the surface coating layer receives a large impact load, a varying load, or the like.

Solution to Problem

The present inventors have diligently studied in order to overcome the above problem and as a result obtained the following findings: When an intermediate layer formed of metal is used it is expected to mediate binding a substrate and a hard coating layer or alleviate impact to some extent, and hence enhance the adhesion of the substrate and the hard coating layer to some extent. However, the intermediate layer is destroyable by large impact load, and this is caused in relation with the intermediate layer's configuration. Accordingly, the present inventors have studied the intermediate layer's configuration based on this fording further in detail and as a result completed the present invention.

More specifically, the present invention provides a surface-coated sintered body including a sintered body of cubic boron nitride and a surface coating layer formed on a surface thereof, the sintered body of cubic boron nitride including 20-99.5% by volume of cubic boron nitride and a binder, the surface coating layer including an adhesion layer and at least one hard coating layer, the adhesion layer being a metal layer including at least W, and being formed to cover a surface of the sintered body of cubic boron nitride, the hard coating layer being formed to coat the adhesion layer, the adhesion layer being configured of an amorphous state and/or ultrafine particles having an average particle size equal to or smaller than 5 nm.

Herein, preferably, the adhesion layer includes at least one of Ti and Cr at an atomic ratio of 0.1-3 relative to W, and preferably, the adhesion layer contains 0.1-20 atomic % of at least one type of element selected from a group consisting of Co, Ni and Fe. Furthermore, preferably, the adhesion layer has a thickness of 1-30 nm.

Preferably, the hard coating layer has a stress of −1.5 to +0.5 GPa, and preferably, the hard coating layer includes a first coating layer as a bottommost layer in contact with the sintered body of cubic boron nitride and the adhesion layer, and the first coating layer is configured of a compound formed of: at least one type of element selected from a group consisting of a group IVa element (Ti, Zr, Hf and the like), a group Va element (V, Nb, Ta and the like) and a group VIa element (Cr, Mo, W and the like) of the periodic table, Al, and Si; and at least one type of element selected from a group consisting of boron, carbon, nitrogen, and oxygen.

Preferably, the first coating layer is configured of: at least one type of compound selected from a group consisting of TiAlN, AlCrN and TiSiCN, or a solid solution including the compound; or a super-multilayer structure having the compound or the solid solution as a constituent layer. Furthermore, preferably, the first coating layer has a region within 20 nm from its interface with the adhesion layer, that is configured of a columnar crystal having a particle size of 1-20 nm. Furthermore, preferably, the hard coating layer has a thickness of 0.5-20 μm.

The present invention also contemplates a cutting tool having a substrate of cemented carbide with a cutting edge having the above described surface-coated sintered body bonded thereto. Preferably, the substrate is formed of cemented carbide, and the cemented carbide includes at least WC and at least one type selected from a group consisting of Co, Ni and Fe.

Advantageous Effects of Invention

The present surface-coated sintered body having the above configuration can provide excellent adhesion between a sintered body of cubic boron nitride and a surface coating layer.

DESCRIPTION OF EMBODIMENTS

Hereinafter, the present invention will be described more specifically.

<Surface-Coated Sintered Body>

The present surface-coated sintered body includes a sintered body of cubic boron nitride and a surface coating layer formed on a surface of the sintered body of cubic boron nitride. The present surface-coated sintered body may have the surface coating layer formed to coat the surface of the sintered body of cubic boron nitride entirely or partially. In particular, as will be described hereinafter, when the surface-coated sintered body is bonded to a substrate and thus used, it is unnecessary that the surface-coated sintered body at the portion thereof bonded to the substrate has the surface coating layer thereon.

<Sintered Body of Cubic Boron Nitride>

The present sintered body of cubic boron nitride includes 20-99.5% by volume of cubic boron nitride, and a binder. As long as the present sintered body of cubic boron nitride contains these two components, the present sintered body of cubic boron nitride may include any other component including an inevitable impurity.

The present sintered body of cubic boron nitride is configured of a number of cubic boron nitride particles, and the binder has an effect to bind each cubic boron nitride particle. Such a binder is not limited in particular but can be selected for example from those having the following compositions:

Composition 1: a compound formed of: at least one type of element selected from a group consisting of a group IVa element, a group Va element and a group VIa element of the periodic table, Al, and Si; and at least one type of element selected from a group consisting of boron, carbon, nitrogen, and oxygen;

Composition 2: a solid solution including the above compound;

Composition 3: a simple substance of metal, such as Co, W, Ni, Al or the like;

Composition 4: a compound including Co, W, Ni, Al, and/or the like;

Composition 5: a solid solution including the compound of composition 1, and Co, W, Ni, Al and/or the like; or Composition 6: the compound of composition 1 further including Co, W, Ni, Al, and/or the like.

Such a binder will be contained in the sintered body of cubic boron nitride normally in an amount accounting for the remainder other than the cubic boron nitride. Conventionally, a sintered body of cubic boron nitride and an adhesion layer have their respective constituent elements diffused at their interface to provide the interface with enhanced adhesion, and accordingly, it has been essential that the binder include W to induce the diffusion of the elements at the interface. In the present invention, in contrast, simply satisfying the adhesion layer's crystal structure can enhance the adhesion between the sintered body of cubic boron nitride and the surface coating layer, and accordingly, it may not be necessary to diffuse the elements of the sintered body of cubic boron nitride and the elements of the adhesion layer at their interface. Thus, if the present invention does not include a binder including W, as conventional, it can still provide an effect equivalent to a case including W. It is of course needless to say that a binder phase may include W.

A sintered body of cubic boron nitride is normally configured of cubic boron nitride particles having an average particle size of approximately about 0.2-10 μm. If the particle size has distribution, however, then it is preferable to provide particles of large particle size closer to a surface (or at a side in contact with the surface coating layer), since this allows the sintered body to adhere to a later described adhesion layer more firmly.

Note that the cubic boron nitride particles' average particle size can be measured by observing the sintered body in cross section with an optical microscope or a scanning electron microscope (SEM).

<Surface Coating Layer>

The present surface coating layer includes an adhesion layer and one or more hard coating layers. As long as the surface coating layer includes these layers, the surface coating layer may include any other layer.

The present surface coating layer is configured as follows: Initially, the adhesion layer is provided to cover a surface of the sintered body of cubic boron nitride. The adhesion layer may be formed to cover the surface of the sintered body of cubic boron nitride entirely or partially. The adhesion layer is coated with the hard coating layer. Note that a portion of the sintered body of cubic boron nitride that is uncovered with the adhesion layer may have the hard coating layer formed thereon without the adhesion layer interposed therebetween.

Such a surface coating layer is formed mainly for the purpose of enhancing the sintered body of cubic boron nitride in wear resistance. Hereinafter, each layer will be described.

<Adhesion Layer>

The present adhesion layer is a metal layer including at least W, and it is formed to cover a surface of the sintered body of cubic boron nitride. The present adhesion layer has an amorphous state and/or is provided in the form of ultrafine particles having an average particle size of 5 nm or smaller to have thermal resistance, strength, and toughness to a high degree and thus allow the sintered body of cubic boron nitride and the surface coating layer to significantly firmly adhere to each other excellently effectively.

Herein, the "metal layer" means that the layer has a main component of a simple substance of metal, and a "surface of the sintered body of cubic boron nitride" includes a portion of the sintered body of cubic boron nitride if the surface coating layer has a component thereof diffused in that portion.

The adhesion layer contains W, which is a metallic material having a relatively high melting point and accordingly softens to a limited extent even when the surface-coated sintered body is exposed to high temperature (e.g., when the surface-coated sintered body is used for a cutting tool, it has its cutting edge less softened in cutting a workpiece). Furthermore, W is highly adhesive to cubic boron nitride particles configuring the sintered body of cubic boron nitride and is also highly adhesive to the hard coating layer. The adhesion layer that at least contains W allows the surface coating layer to have a significantly excellent toughness. W exhibits such an excellent effect because it is believed that W is capable of forming a chemical bond with covalent binding and electrically insulating cubic boron nitride and is capable of forming a chemical bond with a metal binding and electrically conductive hard coating layer.

<Condition of Adhesion Layer>

The present adhesion layer is characterized by having an amorphous state and/or being configured of ultrafine particles having an average particle size of 5 nm or smaller. Furthermore, it is more preferable that the present adhesion layer is a phase of a mixture thereof.

Normally, materials different in bindability or conductance cannot form a chemical bond directly and their interface has poor adhesion. Mixing may be done to allow such materials to have an interface with their elements mixed together to form a compound, and in the present invention, a boride or nitroboride of a metal component contained in the surface coating layer will be formed as such a compound. However, such a boride or nitroboride is a brittle material, and in addition, in the end, a covalently binding, electrically insulating material or a metal binding, electrically conductive material is formed, and it is thus believed that the interface cannot have essentially improved adhesion.

The present adhesion layer, however, contains W, which is a metal binding and electrically conductive metal, which, however, is one of elements having the largest number of electrons among transition metals and accordingly can assume various electron configurations and it is believed that there is a possibility that W forms a chemical bond with a covalently binding material. The present inventors' study has clarified that the adhesion layer (W in particular) that has an amorphous state or is configured of ultrafine particles having an average particle size equal to or smaller than 5 nm assumes a specific electronic structure and thus produces a covalently binding component and a metal binding component, and can form a strong chemical bond with both the covalently binding material or cubic boron nitride and the metal binding and electrically conductive hard coating layer.

Note that an average particle size exceeding 5 nm results in particles having only their surfaces in the above electronic structure, which in turn results in the adhesion layer being as a whole occupied by the above described suitable condition at a reduced degree resulting in having a major portion formed of normal, metal binding W. This reduces density of chemical bond with the cubic boron nitride. Average particle sizes having smaller values are preferable, and accordingly, it is not necessary to define a lower limit value therefor in particular. However, an average particle size less than 0.5 nm is essentially undistinguishable from the amorphous state.

Note that while W may partially be mixed with the cubic boron nitride, the primary phase is preferably W metal which has an amorphous state or is configured of the above described ultrafine particles.

The adhesion layer having the above state is per se improved in strength, hardness, toughness and similar mechanical properties, and thus also excellent in this regard.

If the adhesion layer is entirely amorphous, however, it has a uniform structure and may thus be inferior in strength. If the adhesion layer is entirely configured only of the above described ultrafine particles, a gap may result at a particle boundary of the ultrafine particles, and the adhesion layer may be inferior in strength and toughness. Accordingly, an adhesion layer of a phase of a mixture of an amorphous state and ultrafine particles is particularly preferable, and the adhesion layer thus has an amorphous phase filling gaps between ultrafine particles or has ultrafine particles present in a base phase of the amorphous phase to be an adhesion layer excellent in strength and toughness in particular.

Furthermore, the adhesion layer is provided to have a portion closer to the sintered body of cubic boron nitride, that has an amorphous state more to achieve more excellent adhesion.

Note that the adhesion layer's such state can be determined by measuring the adhesion layer's transmission electron diffraction with a transmission electron microscope (TEM)/energy dispersive X-ray spectrometry (EDS). In this case, when a transmission electron diffraction image includes a halo component, it indicates that an amorphous state (or an amorphous phase) exists. When a diffraction pattern exists, it indicates that ultrafine particles are included. When both are observed, they indicate a phase of a mixture of the both. The ultrafine particles' particle size can be confirmed in a TEM image of high magnification, and their average particle size can be obtained by measuring 10 or more such particles' respective sizes and averaging them.

<Composition of Adhesion Layer>

The present adhesion layer preferably contains 0.05-95 atomic % of W. Containing W allows such an excellent effect as described above. The adhesion layer containing W having a content less than 0.05 atomic % may not obtain the above excellent effect sufficiently. Furthermore, the effect of W is promoted by mixing a small amount of a different element, and accordingly, 95 atomic % or less is preferable. The different element can include oxygen, carbon, nitrogen, boron and similar light elements, a group IVa element, a group Va element, a group VIa element and similar transition metals, Co, Fe, Ni and similar iron group metals, and Y, Al, Si and the like. Note that when W has a content exceeding 95 atomic %, W may crystallize and tend to be inconveniently coarse particles. W's more preferable content is 5-70 atomic %.

Furthermore, the adhesion layer preferably contains one or both of Ti and Cr at an atomic ratio of 0.1-3, more preferably 0.8-2.5 relative to W. When Ti and Cr are both contained, their total atomic ratio shall fall within the above range.

One or both of Ti and Cr contained at the above atomic ratio provides/provide improved mechanical characteristics. Note that when the above atomic ratio is less than 0.1, such improved mechanical characteristics may not be obtained, and an atomic ratio exceeding 3 may result in a hard and brittle adhesion layer and hence inconveniently poor mechanical characteristics.

Furthermore, the present adhesion layer preferably contains 0.1-20 atomic %, more preferably 1-10 atomic % of at least one type of element selected from a group consisting of Co, Ni and Fe. When two or more types of these elements are contained, it is preferable that their total falls within the above range.

Adding at least one type of element selected from a group consisting of Co, Ni and Fe allows W to provide a chemical bond more densely, and provides improved mechanical characteristics. This is because the adhesion layer can more effectively have the above described amorphous state or ultrafine particle structure and a covalently binding component can be increased. The improved mechanical characteristics can include, in particular, an adhesion layer improved in toughness and prevented from fatigue fracture and hence exfoliation.

Note that when the above content is less than 0.1 atomic % the above described effect cannot be obtained, and when the above content exceeds 20 atomic % W's characteristics may be lost.

Such a composition of the adhesion layer can be identified with a transmission electron microscope (TEM)/energy dispersive X-ray spectrometry (EDS).

<Thickness of Adhesion Layer>

Preferably, the adhesion layer has a thickness of 1-30 nm. The adhesion layer having a thickness in this range can per se have large strength and be significantly adhesive to (or have large affinity for) both the cubic boron nitride and the hard coating layer. More preferably, the adhesion layer is 2-20 nm.

The adhesion layer having a thickness less than 1 nm may not be able to supply electrons for forming a chemical component for sufficient covalent bond or metallic bond. The adhesion layer having a thickness exceeding 30 nm has W as a metal dominant in strength, and thus becomes unpreferably brittle or soft.

Such a thickness of the adhesion layer can be identified with a transmission electron microscope (TEM)/energy dispersive X-ray spectrometry (EDS).

<Hard Coating Layer>

The present surface coating layer includes one or more hard coating layers formed to coat the adhesion layer. Preferably, the hard coating layer has a stress of −1.5 to +0.5 GPa, more preferably −1 to 0 GPa.

Herein, stress indicated by a numerical value with the sign "+" indicates tensile stress, and stress indicated by a numerical value with the sign "−" indicates compressive stress. Such a stress can be measured for example by the $\sin^2 \psi$ method or the like.

When the hard coating layer has a stress exceeding 0.5 GPa, the hard coating layer is extremely decreased in strength and toughness, and when it is used as a cutting tool, the tool's cutting edge may have a reduced chipping property (or wear resistance). Furthermore, when the stress is less than −1.5 GPa, the hard coating layer per se is self-destroyed, chips and exfoliates, and may no longer be able to improve wear resistance (or may reduce the adhesion with the sintered body of cubic boron nitride).

Preferably, such a hard coating layer is configured of one or more layers, and, as one layer thereof, includes a first coating layer, as will be described hereinafter. Preferably, such a hard coating layer is configured of a compound formed of: at least one type of element selected from a group consisting of a group IVa element, a group Va element and a group VIa element of the periodic table, Al, and Si; and at least one type of element selected from a group consisting of boron, carbon, nitrogen, and oxygen. This can provide excellent wear resistance.

Furthermore, preferably, the present hard coating layer has a thickness of 0.5-20 μm, more preferably 0.75-7 μm. When the hard coating layer has a thickness less than 0.5 μm, the hard coating layer may not be able to exhibit sufficient wear resistance, whereas when the hard coating layer has a thickness exceeding 20 μm, the hard coating layer exhibits a tendency to chip and exfoliate.

<First Coating Layer>

The present hard coating layer includes a first coating layer as a bottommost layer in contact with the adhesion layer, and preferably, the first coating layer is configured of a compound formed of: at least one type of element selected from a group consisting of a group IVa element (Ti, Zr, Hf and the like), a group Va element (V, Nb, Ta and the like) and a group VIa element (Cr, Mo, W and the like) of the periodic table, Al, and Si; and at least one type of element selected from a group consisting of boron, carbon, nitrogen, and oxygen. Such a compound can for example include TiN, TiCN, $TiB_2$, TiAlN, AlCrN, TiSiCN and the like. Note that in the present invention when the compound is expressed by a chemical formula such as TiCN, it shall include any conventionally known atomic ratios and does not indicate Ti, C and N having an atomic ratio of 1:1:1, unless otherwise indicated.

In particular, preferably, the first coating layer is configured of: at least one type of compound selected from a group consisting of TiAlN, AlCrN and TiSiCN, or a solid solution including the compound; or a super-multilayer structure having the compound or the solid solution as a constituent layer.

The first coating layer having the above described configuration can be extremely increased in hardness, and thus have mechanical characteristics matched with those of the adhesion layer and those of the sintered body of cubic boron nitride and obtain large adhesion to them. Such a first coating layer will be an electrically conductive and metal binding coating, and when the first coating layer has a composition including a nitride of Al or a carbide/nitride of Si, and a solid solution thereof, these compounds partially include a covalently binding bond, and as the present adhesion layer includes both a covalently binding bond and a metal binding bond, the first coating layer and the adhesion layer have a stronger chemical bond and extremely significant adhesion can thus be obtained.

When the first coating layer is configured of the super-multilayer structure, several initial layers formed on the adhesion layer are affected by the adhesion layer and change into an electronic structure which more easily forms a chemical bond, and can thus achieve further increased adhesion to the adhesion layer. Note that a super-multilayer structure refers to a stack of approximately 10-5000 layers each of approximately 0.5-20 nm configured of the above compound or solid solution. More preferably, it is suitable that two or more types of the above constituent layers are stacked repeatedly.

Furthermore, preferably, the first coating layer has a region within 20 nm from its interface with the adhesion layer, as seen in depthwise, that is configured of a columnar crystal having a particle size of 1-20 nm. The first coating layer can thus have excellent structural consistency with the adhesion layer and hence provide further increased adhesion.

Herein, the columnar crystal's particle size means its diameter. Being a columnar crystal can be confirmed with a high resolution SEM or through TEM observation, and its particle size can also be confirmed through TEM observation.

<Application>

While the present surface-coated sintered body can also be used alone, it can for example be bonded to a substrate configured of cemented carbide or the like to be used as a cutting tool or the like. In particular, the present invention is suitable for the use as a cutting tool having a substrate formed of cemented carbide having a cutting edge with the surface-coated sintered body bonded thereto. Herein, preferably, the above cemented carbide includes at least WC and one or more types selected from a group consisting of Co, Ni and Fe.

<Production Method>

The present sintered body of cubic boron nitride can be obtained through a conventionally known process, such as ultra-high-pressure sintering. Furthermore, the surface coating layer can be formed on the sintered body of cubic boron nitride, for example as follows:

That is, the adhesion layer can be formed on the sintered body of cubic boron nitride by sputtering a metal configuring the adhesion layer. The hard coating layer can be formed by arc ion plating or sputtering. When arc ion plating is employed, the hard coating layer can be formed by using a metal evaporation source of a type of metal that will configure the hard coating layer, and a reactive gas such as $CH_4$, $N_2$, $O_2$ or the like, and adopting a conventionally known condition. When sputtering is employed, the hard coating layer can be formed by using a metal evaporation source of a type of metal that will configure the hard coating layer, a reactive gas such as $CH_4$, $N_2$, $O_2$ or the like, and a sputtering gas such as Ar, Kr, Xe, He, Ne or the like, and adopting a conventionally known condition.

The present surface-coated sintered body can thus be produced. When the surface-coated sintered body is bonded for example to a substrate formed of cemented carbide to obtain a cutting tool, it can be produced as follows:

Initially, a cemented carbide substrate can be produced in conventionally known sintering and molding methods. Then, by applying a known wax material to the substrate at an appropriate portion, a known bonding method can be used to bond the surface-coated sintered body to the substrate to produce a cutting tool.

EXAMPLES

Hereinafter, examples will be referred to to describe the present invention more specifically. However, the present invention is not limited thereto. Note that in the following description, a hard coating layer shall indicate a first coating layer, unless otherwise indicated.

Examples 1-8 and Comparative Example 1

A sintered body of cubic boron nitride is bonded to a cutting edge of a cemented carbide substrate and shaped, and subsequently coated to produce a cutting tool.

As the cemented carbide substrate, cemented carbide (corresponding to K10) which was ISO CNMA120408 in geometry was prepared, and its cutting edge portion (or corner) had a sintered body of cubic boron nitride produced as will be described hereinafter (geometry: a triangular prism which had a base in the form of an isosceles triangle having a vertex angle of 80 degrees and two sides sandwiching the vertex angle and each having a length of 2 mm, and had a thickness of 2 mm) bonded thereto with a wax material formed of Ti—Zr—Cu, and the intermediate product then had its periphery and upper and lower surfaces ground to provide the cutting edge with a nega-land (having a width of 150 μm and an angle of 25 degrees) (this product is hereinafter referred to as a tool of the sintered body).

The sintered body of cubic boron nitride was produced so as to contain cubic boron nitride at a ratio (in % by volume) as shown in the following Table 1 by mixing together powdery cubic boron nitride, and a powdery source material for a binder (with Ti used so that the binder's composition was TiCN and $TiB_2$), and by sintering the mixture at 1450° C. and 5.5 GPa. (Note that the powdery source material is blended at a ratio that reflects a composition ratio of the sintered body of cubic boron nitride, unless otherwise indicated, and this also applies to each of the following examples.)

The tool of the sintered body was introduced into a film deposition apparatus and the apparatus was then vacuumed, and thereafter the tool of the sintered body was heated to 500° C. and Ar ion was used to etch it. Subsequently, an adhesion layer was formed on the sintered body of cubic boron nitride in the film deposition apparatus. The adhesion layer was provided as follows: A target having a composition including 35 atomic % of W, 63 atomic % of Cr, 1 atomic % of Co, and 1 atomic % of Ni was prepared, and while Ar was introduced, the target was sputtered with 1 Pa and electric power of 5 kW for a period of time until a thickness of 5 nm was achieved. (Note that the target's composition is identical to the adhesion layer's composition unless otherwise indicated, and this also applies to each of the following examples.) The adhesion layer thus included Cr at an atomic ratio of 1.8 relative to W. The target was sputtered at a temperature adjusted to 300° C. to provide the adhesion layer in an amorphous state.

Subsequently, a hard coating layer was formed on the adhesion layer by arc ion plating. The hard coating layer had a composition of $Ti_{0.85}Si_{0.15}N$, and a metal evaporation source prepared to provide the composition served as a negative electrode and $N_2$ was introduced, while cold-cathode arc discharge was performed to provide evaporation and ionization, and this was continued for a period of time until a thickness of 2 μm was achieved to provide a hard coating layer of $Ti_{0.85}Si_{0.15}N$. Note that a bias voltage adjusted to −30 V, a pressure adjusted to 4 Pa and the substrate's temperature adjusted to 600° C. allow the hard coating layer to have a stress of −1.3 GPa, and have a region within 20 nm from its interface with the adhesion layer, configured of a columnar crystal having a particle size of 2 nm.

Thus, the cutting tools of examples 1-8 and that of comparative example 1 were produced.

Examples 101-109

A surface-coated sintered body was bonded to a cutting edge portion of a cemented carbide substrate to produce a cutting tool.

As the cemented carbide substrate, cemented carbide (corresponding to K10) which was ISO CNMA120408 in geometry was prepared, and its cutting edge portion (or corner) had a sintered body of cubic boron nitride produced as will be described hereinafter (geometry: a triangular prism which had a base in the form of an isosceles triangle having a vertex angle of 80 degrees and two sides sandwiching the vertex angle and each having a length of 2 mm, and had a thickness of 2 mm) bonded thereto with a wax material formed of Ti—Zr—Cu, and the intermediate product then had its periphery and upper and lower surfaces ground to provide the cutting edge with a nega-land (having a width of 150 μm and an angle of 25 degrees) (this product is hereinafter referred to as a tool of the sintered body).

The sintered body of cubic boron nitride was produced so as to contain 90% by volume of cubic boron nitride by mixing together powdery cubic boron nitride, and a powdery source material for a binder (with WC, W, Co, and B used so that the binder's composition was a carbide of W, W, and a boride of Co), and by sintering the mixture at 1500° C. and 5.5 GPa.

The tool of the sintered body was introduced into a film deposition apparatus and the apparatus was then vacuumed, and thereafter the tool of the sintered body was heated to 500° C. and Ar ion was used to etch it. Subsequently, an adhesion layer was formed on the sintered body of cubic boron nitride in the film deposition apparatus. The adhesion layer was provided as follows: a target was prepared to contain Ti and Cr at a composition ratio of 2:1 and Co, Fe, Ni at a composition ratio of 5:1:1, with W, Ti, Co, Ni and Fe having an atomic ratio varied as shown in Table 2, and while Ar was introduced, the target was sputtered with 1 Pa and electric power of 5 kW for a period of time until a thickness of 19 nm was achieved. The target was sputtered at a temperature adjusted to 350° C. to configure the adhesion layer of ultrafine particles having an average particle size of 2.5 nm.

Subsequently, a hard coating layer was formed on the adhesion layer by arc ion plating. The hard coating layer had a composition of $Ti_{0.65}Cr_{0.1}Si_{0.25}N$, and a metal evaporation source prepared to provide the composition served as a negative electrode and $N_2$ was introduced, while cold-cathode arc discharge was performed to provide evaporation and ionization, and this was continued for a period of time until a thickness of 0.9 μm was achieved to provide a hard coating layer of $Ti_{0.65}Cr_{0.1}Si_{0.25}N$. Note that the substrate's temperature adjusted to 600° C., a pressure adjusted to 4 Pa, and a bias voltage adjusted to −30 V allow the hard coating layer to have a stress of −0.7 GPa. Furthermore, setting the substrate's temperature in an early stage of film deposition at 500° C. provided the hard coating layer with a region within 20 nm from its interface with the adhesion layer, configured of a columnar crystal having a particle size of 3 nm.

Thus, the cutting tools of examples 101-109 were produced.

Examples 201-207

A surface-coated sintered body was bonded to a cutting edge portion of a cemented carbide substrate to produce a cutting tool.

As the cemented carbide substrate, cemented carbide (corresponding to K10) which was ISO CNMA120408 in geometry was prepared, and its cutting edge portion (or corner) had a sintered body of cubic boron nitride produced as will be described hereinafter (geometry: a triangular prism which had a base in the form of an isosceles triangle having a vertex angle of 80 degrees and two sides sandwiching the vertex angle and each having a length of 2 mm, and had a thickness of 2 mm) bonded thereto with a wax material formed of Ti—Zr—Cu, and the intermediate product then had its periphery and upper and lower surfaces ground to provide the cutting edge with a nega-land (having a width of 150 μm and an angle of 25 degrees) (this product is hereinafter referred to as a tool of the sintered body).

The sintered body of cubic boron nitride was produced so as to contain 75% by volume of cubic boron nitride by mixing together powdery cubic boron nitride, and a powdery source material for a binder (with Ti and Al used so that the binder's composition was TiN, $TiB_2$, AlN, and $AlB_2$), and by sintering the mixture at 1400° C. and 5.0 GPa.

The tool of the sintered body was introduced into a film deposition apparatus and the apparatus was then vacuumed, and thereafter the tool of the sintered body was heated to 620° C. and Xe ion was used to etch it. Subsequently, an adhesion layer was formed on the sintered body of cubic boron nitride in the film deposition apparatus. The adhesion layer was provided as follows: A target having a composition with W, Cr and Co having their contents varied as shown in Table 3 was prepared, and while Ar was introduced, the target was sputtered with 1 Pa and electric power of 5 kW for a period of time until a thickness of 11 nm was achieved. The target was sputtered at a temperature adjusted to 300° C. to configure the adhesion layer of a phase of a mixture of an amorphous state and ultrafine particles having an average particle size of 1 nm.

Subsequently, a hard coating layer was formed on the adhesion layer by arc ion plating. The hard coating layer had a composition of $Ti_{0.5}Al_{0.5}N$ and an evaporation source prepared to provide the composition served as a negative electrode to perform cold-cathode arc discharge to provide evaporation and ionization, and this was continued for a period of time until a thickness of 3.5 μm was achieved to provide a hard coating layer of $Ti_{0.5}Al_{0.5}N$. Note that the hard coating layer had a stress of −1 GPa. Setting the substrate's temperature in an early stage of film deposition at 600° C. provided the hard coating layer with a region within 20 nm from its interface with the adhesion layer, configured of a columnar crystal having a particle size of 4 nm.

Thus, the cutting tools of examples 201-207 were produced.

Examples 301-307

A surface-coated sintered body was bonded to a cutting edge portion of a cemented carbide substrate to produce a cutting tool.

As the cemented carbide substrate, cemented carbide (corresponding to K10) which was ISO CNMA120408 in geometry was prepared, and its cutting edge portion (or corner) had a sintered body of cubic boron nitride produced as will be described hereinafter (geometry: a triangular prism which had a base in the form of an isosceles triangle having a vertex angle of 80 degrees and two sides sandwiching the vertex angle and each having a length of 2 mm, and had a thickness of 2 mm) bonded thereto with a wax material formed of Ti—Zr—Cu, and the intermediate product then had its periphery and upper and lower surfaces ground to provide the cutting edge with a nega-land (having a width of 150 μm and an angle of 25 degrees) (this product is hereinafter referred to as a tool of the sintered body).

The sintered body of cubic boron nitride was produced so as to contain 42% by volume of cubic boron nitride by mixing together powdery cubic boron nitride, and a powdery source material for a binder (with Ti, W and C used so that the binder's composition was TiWN, WC, and $TiB_2$), and by sintering the mixture at 1350° C. and 5.5 GPa.

The tool of the sintered body was introduced into a film deposition apparatus and the apparatus was then vacuumed, and thereafter the tool of the sintered body was heated to 620° C. and Xe ion was used to etch it. Subsequently, an adhesion layer was formed on the sintered body of cubic boron nitride in the film deposition apparatus. The adhesion layer was provided as follows: A target was prepared to have a composition with W set at 33 atomic %, Ti and Cr having a ratio fixed at 1:1, and Ti, Cr and Ni having their contents varied as shown in Table 4, and while Ar was introduced, the target was sputtered with 1 Pa and electric power of 5 kW for a period of time until a thickness of 2 nm was achieved. The adhesion layer thus included Ti and Cr at an atomic ratio shown in Table 4 relative to W. The target was sputtered at a temperature adjusted to 300° C. to configure the adhesion layer of ultrafine particles having an average particle size of 3 nm.

Subsequently, a hard coating layer was formed on the adhesion layer by arc ion plating. The hard coating layer had a composition of $Ti_{0.2}Al_{0.7}Cr_{0.05}Si_{0.05}N$ and an evaporation source prepared to provide the composition served as a negative electrode to perform cold-cathode arc discharge to provide evaporation and ionization, and this was continued for a period of time until a thickness of 2.2 μm was achieved to provide a hard coating layer of $Ti_{0.2}Al_{0.7}Cr_{0.05}Si_{0.05}N$. Note that the hard coating layer had a stress of −1.2 GPa. Setting the substrate's temperature in an early stage of film deposition at 600° C. provided the hard coating layer with a region within 20 nm from its interface with the adhesion layer, configured of a columnar crystal having a particle size of 1.1 nm.

Thus, the cutting tools of examples 301-307 were produced.

Examples 401-409

A surface-coated sintered body was bonded to a cutting edge portion of a cemented carbide substrate to produce a cutting tool.

As the cemented carbide substrate, cemented carbide (corresponding to K10) which was ISO CNMA120408 in geometry was prepared, and its cutting edge portion (or corner) had a sintered body of cubic boron nitride produced as will be described hereinafter (geometry: a triangular prism which had a base in the form of an isosceles triangle having a vertex angle of 80 degrees and two sides sandwiching the vertex angle and each having a length of 2 mm, and had a thickness of 2 mm) bonded thereto with a wax material formed of Ti—Zr—Cu, and the intermediate product then had its periphery and upper and lower surfaces ground to provide the cutting edge with a nega-land (having a width of 150 μm and an angle of 25 degrees) (this product is hereinafter referred to as a tool of the sintered body).

The sintered body of cubic boron nitride was produced so as to contain 65% by volume of cubic boron nitride by mixing together powdery cubic boron nitride, and a powdery source material for a binder (with Ti, ZrC and Al used so that the binder's composition was TiZrCN, $TiB_2$, AlN, and $AlB_2$), and by sintering the mixture at 1400° C. and 5.5 GPa.

The tool of the sintered body was introduced into a film deposition apparatus and the apparatus was then vacuumed, and thereafter the tool of the sintered body was heated to 620° C. and Xe ion was used to etch it. Subsequently, an adhesion layer was formed on the sintered body of cubic boron nitride in the film deposition apparatus. The adhesion layer was provided as follows: A target having a composition to provide 80 atomic % of W, 12 atomic % of Cr, and 8 atomic % of Co was prepared, and while Ar was introduced, the target was sputtered with 1 Pa and electric power of 5 kW for a period of time adjusted to provide a thickness as shown in Table 5. The adhesion layer thus included Cr at an atomic ratio of 0.15 relative to W. The target was sputtered at a temperature adjusted to 300° C. to configure the adhesion layer of a phase of a mixture of an amorphous state and ultrafine particles having an average particle size of 0.7 nm.

Subsequently, a hard coating layer was formed on the adhesion layer by arc ion plating. The hard coating layer had a composition of $Ti_{0.4}Al_{0.6}N$ and $Al_{0.6}Cr_{0.3}Si_{0.1}N$, stacked on one another alternately, each by 800 layers, to form a supermultilayer structure, and two types of evaporation sources of $Ti_{0.4}Al_{0.6}$ and $Al_{0.6}Cr_{0.3}Si_{0.1}$ were simultaneously discharged and the tool of the sintered body was rotated to pass between each evaporation source to have the hard coating layer thereon. The film deposition time continued until the hard coating layer attained a thickness of 4 μm. Note that by applying as a bias voltage a pulse bias varied from −50 V to 0 V at 50 kHz, the hard coating layer's stress was +0.4 GPa. Setting the substrate's temperature in an early stage of film deposition at 600° C. provided the hard coating layer with a region within 20 nm from its interface with the adhesion layer, configured of a columnar crystal having a particle size of 10 nm.

Thus, the cutting tools of examples 401-409 were produced.

Examples 501-506 and Comparative Example 501

A surface-coated sintered body was bonded to a cutting edge portion of a cemented carbide substrate to produce a cutting tool.

As the cemented carbide substrate, cemented carbide (corresponding to K10) which was ISO CNMA120408 in geometry was prepared, and its cutting edge portion (or corner) had a sintered body of cubic boron nitride produced as will be described hereinafter (geometry: a triangular prism which had a base in the form of an isosceles triangle having a vertex angle of 80 degrees and two sides sandwiching the vertex angle and each having a length of 2 mm, and had a thickness of 2 mm) bonded thereto with a wax material formed of Ti—Zr—Cu, and the intermediate product then had its periphery and upper and lower surfaces ground to provide the cutting edge with a nega-land (having a width of 150 μm and an angle of 25 degrees) (this product is hereinafter referred to as a tool of the sintered body).

The sintered body of cubic boron nitride was produced so as to contain 80% by volume of cubic boron nitride by mixing together powdery cubic boron nitride, and a powdery source material for a binder (with Ti, Al and Si used so that the binder's composition was TiN, $TiB_2$, AlN, $AlB_2$, and $Si_3N_4$), and by sintering the mixture at 1450° C. and 5.5 GPa.

The tool of the sintered body was introduced into a film deposition apparatus and the apparatus was then vacuumed, and thereafter the tool of the sintered body was heated to 620° C. and Xe ion was used to etch it. Subsequently, an adhesion layer was formed on the sintered body of cubic boron nitride in the film deposition apparatus. The adhesion layer was formed to have a composition of 47 atomic % of W, 51.7 atomic % of Cr, and 1.3 atomic % of Co by vapor-depositing W and Co through sputtering and by simultaneously vapor-depositing Cr through arc ion plating. The adhesion layer was deposited continuously for a period of time until it attained a thickness of 9 nm. The adhesion layer thus included Cr at an atomic ratio of 1.1 relative to W. Note that the sputtering and the arc ion plating were done with the substrate's temperature adjusted to 350° C. to 650° C. and a bias voltage adjusted to −50 V to −500 V to vary the adhesion layer's condition, as shown in Table 6.

Subsequently, a hard coating layer was formed on the adhesion layer by arc ion plating. Preparation was done to allow the hard coating layer to have a composition of $Al_{0.65}Ti_{0.3}Si_{0.05}C_{0.05}N_{0.95}$, and while $N_2$ and $CH_4$ were introduced, a pressure of 1.3 Pa was applied and an evaporation source served as a negative electrode to perform cold-cathode arc discharge to provide evaporation and ionization, and this was continued for a period of time until a thickness of 4.5 μm was achieved to provide a hard coating layer of $Al_{0.65}Ti_{0.3}Si_{0.05}C_{0.05}N_{0.95}$. Note that by applying as a bias voltage a pulse bias varied from −50 V to 0 V at 50 kHz, the hard coating layer's stress was −0.2 GPa. Furthermore, setting the substrate's temperature in an early stage of film deposition at 600° C. provided the hard coating layer with a region within 20 nm from its interface with the adhesion layer, configured of a columnar crystal having a particle size of 1.5 nm.

Thus, the cutting tools of examples 501-506 and that of comparative example 501 were produced.

Examples 601-607

A surface-coated sintered body was bonded to a cutting edge portion of a cemented carbide substrate to produce a cutting tool.

As the cemented carbide substrate, cemented carbide (corresponding to K10) which was ISO CNMA120408 in geometry was prepared, and its cutting edge portion (or corner) had a sintered body of cubic boron nitride produced as will be described hereinafter (geometry: a triangular prism which had a base in the form of an isosceles triangle having a vertex angle of 80 degrees and two sides sandwiching the vertex angle and each having a length of 2 mm, and had a thickness of 2 mm) bonded thereto with a wax material formed of Ti—Zr—Cu, and the intermediate product then had its periphery and upper and lower surfaces ground to provide the cutting edge with a nega-land (having a width of 150 μm and an angle of 25 degrees) (this product is hereinafter referred to as a tool of the sintered body).

The sintered body of cubic boron nitride was produced so as to contain 50% by volume of cubic boron nitride by mixing together powdery cubic boron nitride, and a powdery source material for a binder (with Ti and Al used so that the binder's composition was TiC, $Al_2O_3$ and $TiB_2$), and by sintering the mixture at 1450° C. and 6.0 GPa.

The tool of the sintered body was introduced into a film deposition apparatus and the apparatus was then vacuumed, and thereafter the tool of the sintered body was heated to 620° C. and Xe ion was used to etch it. Subsequently, an adhesion layer was formed on the sintered body of cubic boron nitride in the film deposition apparatus. The adhesion layer was provided as follows: A target having a composition of 65 atomic % of W and 33 atomic % of Fe was prepared, and while Ar was introduced, the target was sputtered with 1 Pa and electric power of 5 kW for a period of time until a thickness of 15 nm was achieved. The target was sputtered at a temperature adjusted to 300° C. to configure the adhesion layer of a phase of a mixture of an amorphous state and ultrafine particles having an average particle size of 4.5 nm.

Subsequently, a hard coating layer was formed on the adhesion layer by arc ion plating. The hard coating layer had a composition of $Ti_{0.93}Si_{0.07}N$ and $Ti_{0.5}Al_{0.3}Cr_{0.1}Si_{0.1}N$, stacked on one another alternately, each by 315 layers, to form a super-multilayer structure, and two types of evaporation sources of $Ti_{0.93}Si_{0.07}$ and $Ti_{0.5}Al_{0.3}Cr_{0.1}Si_{0.1}$ were simultaneously discharged and the tool of the sintered body was rotated to pass between each evaporation source to have the hard coating layer thereon. The film deposition time continued until the hard coating layer attained a thickness of 6.3 μm. Note that by adjustment of bias voltage, the hard coating layer had a stress indicated in Table 7. Furthermore, setting the substrate's temperature in an early stage of film deposition at 600° C. provided the hard coating layer with a region within 20 nm from its interface with the adhesion layer, configured of a columnar crystal having a particle size of 15 nm.

Thus, the cutting tools of examples 601-607 were produced.

Examples 701-708

A surface-coated sintered body was bonded to a cutting edge portion of a cemented carbide substrate to produce a cutting tool.

As the cemented carbide substrate, cemented carbide (corresponding to K10) which was ISO CNMA120408 in geometry was prepared, and its cutting edge portion (or corner) had a sintered body of cubic boron nitride produced as will be described hereinafter (geometry: a triangular prism which had a base in the form of an isosceles triangle having a vertex angle of 80 degrees and two sides sandwiching the vertex angle and each having a length of 2 mm, and had a thickness of 2 mm) bonded thereto with a wax material formed of Ti—Zr—Cu, and the intermediate product then had its periphery and upper and lower surfaces ground to provide the cutting edge with a nega-land (having a width of 150 μm and an angle of 25 degrees) (this product is hereinafter referred to as a tool of the sintered body).

The sintered body of cubic boron nitride was produced so as to contain 97% by volume of cubic boron nitride by mixing together powdery cubic boron nitride, and a powdery source material for a binder (with Al used so that the binder's composition was Al, AlN, and $AlB_2$), and by sintering the mixture at 1450° C. and 6.0 GPa.

The tool of the sintered body was introduced into a film deposition apparatus and the apparatus was then vacuumed, and thereafter the tool of the sintered body was heated to 620° C. and Xe ion was used to etch it. Subsequently, an adhesion layer was formed on the sintered body of cubic boron nitride in the film deposition apparatus. The adhesion layer was provided as follows: A target having a composition including 91 atomic % of W and 9 atomic % of Ti was prepared, and while Ar was introduced, the target was sputtered with 1 Pa and electric power of 5 kW for a period of time until a thickness of 27 nm was achieved. The adhesion layer thus included Ti at an atomic ratio of 0.1 relative to W. The target was sputtered at a temperature adjusted to 300° C. to provide the adhesion layer in an amorphous state.

Subsequently, a hard coating layer was formed on the adhesion layer by arc ion plating. The hard coating layer had a composition of $Ti_{0.5}Al_{0.5}CN$ and an evaporation source prepared to provide the composition served as a negative electrode to perform cold-cathode arc discharge to provide evaporation and ionization for a period of time adjusted to provide a thickness indicated in Table 8 to provide a hard coating layer of $Ti_{0.5}Al_{0.5}CN$. Note that by applying as a bias voltage a pulse bias varied from −50 V to 0 V at 50 kHz, the hard coating layer's stress was −0.1 GPa. Furthermore, setting the substrate's temperature in an early stage of film deposition at 600° C. provided the hard coating layer with a region within 20 nm from its interface with the adhesion layer, configured of a columnar crystal having a particle size of 19 nm.

Thus, the cutting tools of examples 701-708 were produced.

Examples 801-806

A surface-coated sintered body was bonded to a cutting edge portion of a cemented carbide substrate to produce a cutting tool.

As the cemented carbide substrate, cemented carbide which was ISO CNMA 120408 in geometry was prepared, and its cutting edge portion (or corner) had a sintered body of cubic boron nitride produced as will be described hereinafter (geometry: a triangular prism which had a base in the form of an isosceles triangle having a vertex angle of 80 degrees and two sides sandwiching the vertex angle and each having a length of 2 mm, and had a thickness of 2 mm) bonded thereto with a wax material formed of Ti—Zr—Cu, and the intermediate product then had its periphery and upper and lower surfaces ground to provide the cutting edge with a nega-land (having a width of 150 μm and an angle of 25 degrees) (this product is hereinafter referred to as a tool of the sintered body).

The sintered body of cubic boron nitride was produced so as to contain 70% by volume of cubic boron nitride by mixing together powdery cubic boron nitride, and a powdery source material for a binder (with Ti and Al used so that the binder's composition was TiCN, $TiB_2$, AlN, and $AlB_2$), and by sintering the mixture at 1350° C. and 6.0 GPa.

The tool of the sintered body was introduced into a film deposition apparatus and the apparatus was then vacuumed, and thereafter the tool of the sintered body was heated to 620°

C. and Xe ion was used to etch it. Subsequently, an adhesion layer was formed on the sintered body of cubic boron nitride in the film deposition apparatus. The adhesion layer was deposited as follows: Ar and Xe were introduced at the same flow rate ratio to provide 3.0 Pa, and a bias voltage of −1000 V was applied to a substrate to etch it and its cemented carbide component achieved a thickness of 8 nm on a cutting edge of the sintered body of cubic boron nitride. Cemented-carbide of a composition which would provide 82 atomic % of W, 10 atomic % of Co, 5 atomic % of Ni, and 3 atomic % of Fe was prepared. The above deposition was done at a temperature adjusted to 300° C. to configure the adhesion layer of a phase of a mixture of an amorphous state and ultrafine particles having an average particle size of 2.2 nm.

Subsequently, a hard coating layer was formed on the adhesion layer by arc ion plating. The hard coating layer had a composition of $Al_{0.7}Cr_{0.3}N$ and $Ti_{0.4}Al_{0.55}Si_{0.05}N$ stacked on one another alternately, each by a single layer, to form a super-multilayer structure, and two types of evaporation sources of $Al_{0.7}Cr_{0.3}$ and $Ti_{0.4}Al_{0.55}Si_{0.05}$ were simultaneously discharged and the tool of the sintered body was rotated to pass between each evaporation source to have the hard coating layer thereon. The film deposition time continued until the hard coating layer attained a thickness of 12 μm. Note that by applying as a bias voltage a pulse bias varied from −50 V to 0 V at 50 kHz, the hard coating layer's stress was +1.5 GPa. Furthermore, the substrate's temperature in an early stage of film deposition was set at 600° C. to provide the hard coating layer with a region within 20 nm from its interface with the adhesion layer, having a columnar crystal having a particle size varied as shown in Table 9.

Thus, the cutting tools of examples 801-806 were produced.

Example 901

A surface-coated sintered body was bonded to a cutting edge portion of a cemented carbide substrate to produce a cutting tool.

As the cemented carbide substrate, cemented carbide (corresponding to K10) which was ISO CNMA120408 in geometry was prepared, and its cutting edge portion (or corner) had a sintered body of cubic boron nitride produced as will be described hereinafter (geometry: a triangular prism which had a base in the form of an isosceles triangle having a vertex angle of 80 degrees and two sides sandwiching the vertex angle and each having a length of 2 mm, and had a thickness of 2 mm) bonded thereto with a wax material formed of Ti—Zr—Cu, and the intermediate product then had its periphery and upper and lower surfaces ground to provide the cutting edge with a nega-land (having a width of 15.0 μm and an angle of 25 degrees) (this product is hereinafter referred to as a tool of the sintered body).

The sintered body of cubic boron nitride was produced so as to contain 68% by volume of cubic boron nitride by mixing together powdery cubic boron nitride, and a powdery source material for a binder (with $TiAl_2$ and W used so that the binder's composition was TiCN, $TiB_2$, AlN, $AlB_2$, and WC), and by sintering the mixture at 1300° C. and 6.0 GPa.

The tool of the sintered body was introduced into a film deposition apparatus and the apparatus was then vacuumed, and thereafter the tool of the sintered body was heated to 620° C. and Xe ion was used to etch it. Subsequently, an adhesion layer was formed on the sintered body of cubic boron nitride in the film deposition apparatus. The adhesion layer was provided as follows: A target having a composition which will provide 42 atomic % of W, 42 atomic % of Cr, and 16 atomic % of Co was prepared, and while Ar was introduced, the target was sputtered with 1. Pa and electric power of 5 kW for a period of time adjusted to provide a thickness of 12 nm. The target was sputtered at a temperature adjusted to 300° C. to configure the adhesion layer of a phase of a mixture of an amorphous state and ultrafine particles having an average particle size of 1.2 nm.

Subsequently, a hard coating layer was formed on the adhesion layer by arc ion plating. The hard coating layer was configured of a first coating layer formed of $Ti_{0.4}Al_{0.6}N$ and having a thickness of 0.3 μm, and a layer formed on the first coating layer, formed of $Ti_{0.5}Cr_{0.45}Si_{0.05}N$ and having a thickness of 3.2 μM (hereinafter referred to as a "second coating layer"). More specifically, an evaporation source prepared to provide such a composition served as a negative electrode to perform cold-cathode arc discharge to provide evaporation and ionization and provide deposition for a period of time adjusted to provide the above thickness. Note that by applying as a bias voltage a pulse bias varied from −100 V to 0 V at 100 kHz, the hard coating layer's stress was −0.7 GPa. Setting the substrate's temperature in an early stage of film deposition at 600° C. provides the first coating layer with a region within 20 nm from its interface with the adhesion layer, configured of a columnar crystal having a particle size of 4 nm.

Thus, the cutting tool of example 901 was produced.

Example 902

A surface-coated sintered body was bonded to a cutting edge portion of a cemented carbide substrate to produce a cutting tool.

As the cemented carbide substrate, cemented carbide (corresponding to K10) which was ISO CNMA120408 in geometry was prepared, and its cutting edge portion (or corner) had a sintered body of cubic boron nitride produced as will be described hereinafter (geometry: a triangular prism which had a base in the form of an isosceles triangle having a vertex angle of 80 degrees and two sides sandwiching the vertex angle and each having a length of 2 mm, and had a thickness of 2 mm) bonded thereto with a wax material formed of Ti—Zr—Cu, and the intermediate product then had its periphery and upper and lower surfaces ground to provide the cutting edge with a nega-land (having a width of 150 μm and an angle of 25 degrees) (this product is hereinafter referred to as a tool of the sintered body).

The sintered body of cubic boron nitride was produced so as to contain 55% by volume of cubic boron nitride by mixing together powdery cubic boron nitride, and a powdery source material for a binder (with Ti, Al and W used so that the binder's composition was TiCN, $TiB_2$, AlN, $AlB_2$, and WC), and by sintering the mixture at 1300° C. and 6 GMPa.

The tool of the sintered body was introduced into a film deposition apparatus and the apparatus was then vacuumed, and thereafter the tool of the sintered body was heated to 620° C. and Xe ion was used to etch it. Subsequently, an adhesion layer was formed on the sintered body of cubic boron nitride in the film deposition apparatus. The adhesion layer was provided as follows: A target having a W—Co composition which will provide 21 atomic % of W, 63 atomic % of Ti, and 16 atomic % of Co was prepared, and while Ar was introduced, the target was sputtered with 1 Pa and electric power of 5 kW for a period of time adjusted to provide a thickness of 9 nm. Note, however, that while the adhesion layer was deposited by sputtering, arc ion plating was employed to evaporate Ti to deposit the adhesion layer of the above composition. The target was sputtered at a temperature adjusted to 300° C. to configure the adhesion layer of a phase of a mixture of an amorphous state and ultrafine particles having an average particle size of 1.3 nm.

Subsequently, a hard coating layer was formed on the adhesion layer by arc ion plating. The hard coating layer was configured of a first coating layer formed of $Ti_{0.2}Al_{0.7}Si_{0.1}N$ and having a thickness of 0.7 μm, and a layer formed on the first coating layer, formed of $Ti_{0.92}Si_{0.08}C_{0.2}N_{0.8}$ and having a thickness of 1.3 μm (hereinafter referred to as a "second coating layer"). More specifically, an evaporation source prepared to provide such a composition served as a negative electrode to perform cold-cathode arc discharge to provide evaporation and ionization and provide deposition for a period of time adjusted to provide the above thickness. Note that by applying as a bias voltage a pulse bias varied from −50 V to 0 V at 50 kHz, the hard coating layer's stress was −0.5 GPa. Setting the substrate's temperature in an early stage of film deposition at 600° C. provides the first coating layer with a region within 20 nm from its interface with the adhesion layer, configured of a columnar crystal having a particle size of 2.5 nm.

Thus, the cutting tool of example 902 was produced.

Example 903

A surface-coated sintered body was bonded to a cutting edge portion of a cemented carbide substrate to produce a cutting tool.

As the cemented carbide substrate, cemented carbide (corresponding to K10) which was ISO CNMA120408 in geometry was prepared, and its cutting edge portion (or corner) had a sintered body of cubic boron nitride produced as will be described hereinafter (geometry: a triangular prism which had a base in the form of an isosceles triangle having a vertex angle of 80 degrees and two sides sandwiching the vertex angle and each having a length of 2 mm, and had a thickness of 2 mm) bonded thereto with a wax material formed of Ti—Zr—Cu, and the intermediate product then had its periphery and upper and lower surfaces ground to provide the cutting edge with a nega-land (having a width of 150 μm and an angle of 25 degrees) (this product is hereinafter referred to as a tool of the sintered body).

The sintered body of cubic boron nitride was produced so as to contain 50% by volume of cubic boron nitride by mixing together powdery cubic boron nitride, and a powdery source material for a binder (with TiN, AlN and W used so that the binder's composition was TiCN, $TiB_2$, AlN, $AlB_2$, and WC), and by sintering the mixture at 1300° C. and 5.0 GPa.

The tool of the sintered body was introduced into a film deposition apparatus and the apparatus was then vacuumed, and thereafter the tool of the sintered body was heated to 620° C. and Xe ion was used to etch it. Subsequently, an adhesion layer was formed on the sintered body of cubic boron nitride in the film deposition apparatus. The adhesion layer was provided as follows: A target having a composition which will provide 75 atomic % of W and 25 atomic % of Ni was prepared, and while Ar was introduced, the target was sputtered with 1 Pa and electric power of 5 kW for a period of time adjusted to provide a thickness of 5 nm. The target was sputtered at a temperature adjusted to 300° C. to configure the adhesion layer of a phase of a mixture of an amorphous state and ultrafine particles having an average particle size of 1.1 nm.

Subsequently, a hard coating layer was formed on the adhesion layer by arc ion plating. The hard coating layer was configured of a first coating layer formed of $Ti_{0.7}Zr_{0.1}Si_{0.2}N$ and having a thickness of 0.5 μm, and a layer formed on the first coating layer and formed of $Ti_{0.7}Zr_{0.1}Si_{0.2}N$ and $Al_{0.7}Ti_{0.3}N$ alternately deposited to provide a super-multi-layer structure having a thickness of 1 μm (hereinafter referred to as a "second coating layer"). Specifically, the first coating layer was deposited as follows: An evaporation source prepared to provide such a composition as above served as a negative electrode to perform cold-cathode arc discharge to provide evaporation and ionization and provide deposition for a period of time adjusted to provide the above thickness. The second coating layer was produced by simultaneously discharging two types of evaporation sources of $Ti_{0.7}Zr_{0.1}Si_{0.2}$ and $Al_{0.7}Ti_{0.3}$, and rotating the tool of the sintered body to pass between each evaporation source. Note that by applying as a bias voltage a pulse bias varied from −150 V to 0 V at 200 kHz, the hard coating layer's stress was −1.1 GPa. Setting the substrate's temperature in an early stage of film deposition at 600° C. provides the first coating layer with a region within 20 nm from its interface with the adhesion layer, configured of a columnar crystal having a particle size of 1.8 nm.

Thus, the cutting tool of example 903 was produced.

Comparative Example 901

A surface-coated sintered body was bonded to a cutting edge portion of a cemented carbide substrate to produce a cutting tool.

As the cemented carbide substrate, cemented carbide (corresponding to K10) which was ISO CNMA120408 in geometry was prepared, and its cutting edge portion (or corner) had a sintered body of cubic boron nitride produced as will be described hereinafter (geometry: a triangular prism which had a base in the form of an isosceles triangle having a vertex angle of 80 degrees and two sides sandwiching the vertex angle and each having a length of 2 mm, and had a thickness of 2 mm) bonded thereto with a wax material formed of Ti—Zr—Cu, and the intermediate product then had its periphery and upper and lower surfaces ground to provide the cutting edge with a nega-land (having a width of 150 μm and an angle of 25 degrees) (this product is hereinafter referred to as a tool of the sintered body).

The sintered body of cubic boron nitride was produced so as to contain 45% by volume of cubic boron nitride by mixing together powdery cubic boron nitride, and a powdery source material for a binder (with Ti, Al and W used so that the binder's composition was TiCN, $TiB_2$, AlN, $AlB_2$, and WC), and by sintering the mixture at 1350° C. and 5 GPa.

The tool of the sintered body was introduced into a film deposition apparatus and the apparatus was then vacuumed, and thereafter the tool of the sintered body was heated to 620° C. and Xe ion was used to etch it. Subsequently, no adhesion layer was formed on the sintered body of cubic boron nitride in the film deposition apparatus, and a hard coating layer was directly formed by arc ion plating. The hard coating layer was configured as a layer formed of $Ti_{0.5}Al_{0.5}N$ and having a thickness of 3 μm. More specifically, an evaporation source prepared to provide such a composition served as a negative electrode to perform cold-cathode arc discharge to provide evaporation and ionization and provide deposition for a period of time adjusted to provide the above thickness. Note that by applying as a bias voltage a pulse bias varied from −150 V to 0 V at 50 kHz, the hard coating layer's stress was −1 GPa. Setting the substrate's temperature in an early stage of film deposition at 600° C. provided the hard coating layer with a region within 20 nm from its interface with the adhesion layer, configured of a columnar crystal having a particle size of 10 nm.

Thus, the cutting tool of comparative example 901 was produced.

<Measurement Conditions>

The above examples and comparative examples were measured for numerical values, as follows:

<Measuring Surface Coating Layer>

The adhesion layer's state (or structure) including thickness, composition and crystallinity, and its ultrafine particles' average particle size were evaluated through measurement, as follows: More specifically, a cross section including the sintered body of cubic boron nitride and the surface coating layer was initially prepared by the focused ion beam (FIB) method. Then, in the cross section, an interface of the sintered body of cubic boron nitride and the adhesion layer was observed with a scanning transmission electron microscope (STEM)/energy dispersive X-ray spectrometry (EDS).

Then, "thickness", "composition", "state", and a particle size of a columnar crystal in the hard coating layer (or the first coating layer) at a region within 20 nm from an interface of the hard coating layer and the adhesion layer were measured through "STEM observation", "EDS analysis", and "electron diffraction", respectively. Furthermore, the hard coating layer's thickness, composition, and the like were also obtained similarly as done for the adhesion layer.

Note that the EDS analysis was done with a sample processed with an ion beam to be approximately 100 nm in thickness, and the STEM's electron beam diameter set at 1 nm $\phi$. In this case, the electron beam was incident at an angle adjusted such that the adhesion layer's contrast or the W's contrast is maximized as compared with another metallic element component (including a metallic element configuring the hard coating layer), B and the like.

Furthermore, the adhesion layer has unevenness, and when the adhesion layer's composition was observed, an element of the hard coating layer and an element of the sintered body of cubic boron nitride may be detected. Furthermore, when the adhesion layer or the hard coating layer is formed, the energy of a type of film deposited can be controlled to mix the adhesion layer and the sintered body of cubic boron nitride or the hard coating layer. This, however, also results in such an analysis result as above. A result detected in such a case was also included as a composition of the adhesion layer.

Note that SEM shows a composition in an image such that a W-containing adhesion layer is observed as a layer having a particularly high lightness, and accordingly, the adhesion layer can be determined simply from whether this bright layer exists or not.

<Evaluation Method>

The cutting tools of the examples and comparative examples obtained as above were used under the following cutting conditions to perform two types of cutting tests. Cutting test A can mainly evaluate the hard coating layer's adhesion, wear resistance, and chippage resulting from accumulated chipping, and cutting test B can evaluate the hard coating layer's adhesion, wear resistance, and anti-chipping property against relatively large chipping. The tests both indicate as a tool's lifetime a period of time (i.e., a machining time) elapsing before flank wear (Vb) attains 0.2 mm and longer machining time indicates better adhesion between the sintered body of cubic boron nitride and the surface coating layer (i.e., excellence in both wear resistance and toughness). Results are shown in tables 1-10. Note that in the tables, the term "exfoliated/chipped" indicates that the surface coating layer exfoliated during a cutting test or a cutting tool chipped and its machining time was unmeasurable.

<Cutting Test A (Light Interrupted Test)>
Cutting speed: V=120 m/min
Feed: f=0.3 mm/rev
Cut: d=0.3 mm
Wet type/dry type: Dry type
Workpiece: SCN435 carburizing material (HRC62) in the form of a round bar with mill scale <Cutting Test B (Heavy Interrupted Test)>
Cutting speed: V=200 m/min
Feed: f=0.15 mm/rev
Cut: d=2.0 mm
Wet type/dry type: Dry type
Workpiece: SUJ2 (HRC60) in the form of a round bar having longitudinally extending 6 grooves

TABLE 1

|  | content of cubic boron nitride (% by volume) | cutting test A (minutes) | cutting test B (minutes) |
|---|---|---|---|
| comp. ex. 1 | 10 | exfoliated/chipped | exfoliated/chipped |
| ex. 1 | 25 | 26 | 17 |
| ex. 2 | 45 | 32 | 19 |
| ex. 3 | 60 | 37 | 22 |
| ex. 4 | 70 | 43 | 24 |
| ex. 5 | 80 | 35 | 28 |
| ex. 6 | 85 | 24 | 35 |
| ex. 7 | 95 | 17 | 40 |
| ex. 8 | 99 | 14 | 17 |
| comp. ex. 2 | 99.8 | 5 | 7 |

TABLE 2

|  | content of W (atomic %) | (Ti + Cr)/W (atomic ratio) | Co, Ni, Fe (atomic %) | cutting test A (minutes) | cutting test B (minutes) |
|---|---|---|---|---|---|
| ex. 101 | 5 | 16 | 15 | 17 | 21 |
| ex. 102 | 12 | 6.2 | 13.6 | 25 | 28 |
| ex. 103 | 30 | 1.9 | 13 | 32 | 41 |
| ex. 104 | 42 | 1. | 16 | 38 | 46 |
| ex. 105 | 58 | 0.7 | 1.4 | 34 | 40 |
| ex. 106 | 80 | 0.2 | 4 | 31 | 30 |
| ex. 107 | 95 | — | 5 | 27 | 23 |
| ex. 108 | 99 | — | — | 26 | 17 |
| ex. 109 | 99.5 | — | — | 20 | 14 |

TABLE 3

| | content of W (atomic %) | content of Cr (atomic ratio relative to W) | Co (atomic %) | cutting test A (minutes) | cutting test B (minutes) |
|---|---|---|---|---|---|
| ex. 201 | 55 | 0.01 | 44.5 | 16 | 27 |
| ex. 202 | 50 | 0.5 | 25 | 32 | 31 |
| ex. 203 | 39 | 1.1 | 18.1 | 44 | 39 |
| ex. 204 | 35 | 1.4 | 16 | 51 | 47 |
| ex. 205 | 31 | 1.9 | 10.1 | 44 | 41 |
| ex. 206 | 24 | 2.8 | 8.8 | 33 | 29 |
| ex. 207 | 20 | 3.6 | 8 | 26 | 23 |

TABLE 4

| | content of Ti + Cr (atomic ratio relative to W) | Ni (atomic %) | cutting test A (minutes) | cutting test B (minutes) |
|---|---|---|---|---|
| ex. 301 | 2 | 0.05 | 15 | 17 |
| ex. 302 | 2 | 0.15 | 31 | 24 |
| ex. 303 | 1.9 | 4.3 | 39 | 32 |
| ex. 304 | 1.8 | 7.6 | 46 | 42 |
| ex. 305 | 1.7 | 11 | 37 | 37 |
| ex. 306 | 1.4 | 20.8 | 31 | 36 |
| ex. 307 | 1.1 | 30.7 | 25 | 27 |

TABLE 5

| | thickness of adhesion layer (nm) | cutting test A (minutes) | cutting test B (minutes) |
|---|---|---|---|
| ex. 401 | 0.5 | 10 | 12 |
| ex. 402 | 1.2 | 19 | 22 |
| ex. 403 | 3 | 23 | 29 |
| ex. 404 | 5 | 37 | 34 |
| ex. 405 | 8 | 44 | 41 |
| ex. 406 | 12 | 43 | 37 |
| ex. 407 | 17 | 37 | 35 |
| ex. 408 | 25 | 35 | 30 |
| ex. 409 | 40 | 12 | 15 |

TABLE 6

| | state of adhesion layer | cutting test A (minutes) | cutting test B (minutes) |
|---|---|---|---|
| ex. 501 | amorphous | 40 | 18 |
| ex. 502 | amorphous + ultrafine particles (0.7) | 43 | 30 |
| ex. 503 | amorphous + ultrafine particles (1.2) | 44 | 41 |
| ex. 504 | amorphous + ultrafine particles (2.5) | 39 | 36 |
| ex. 505 | amorphous + ultrafine particles (3.2) | 25 | 34 |
| ex. 506 | amorphous + ultrafine particles (4.8) | 18 | 30 |
| comp. ex. 501 | amorphous + fine particles (20) | exfoliated/chipped | exfoliated/chipped |

TABLE 7

| | stress of hard coating layer (GPa) | cutting test A (minutes) | cutting test B (minutes) |
|---|---|---|---|
| ex. 601 | +1 | chipped | chipped |
| ex. 602 | +0.3 | 33 | 16 |
| ex. 603 | −0.1 | 39 | 28 |
| ex. 604 | −0.7 | 46 | 40 |
| ex. 605 | −1.2 | 35 | 33 |
| ex. 606 | −1.4 | 25 | 29 |
| ex. 607 | −3 | exfoliated/chipped | exfoliated/chipped |

TABLE 8

| | thickness of hard coating layer (μm) | cutting test A (minutes) | cutting test B (minutes) |
|---|---|---|---|
| ex. 701 | 0.2 | chipped | chipped |
| ex. 702 | 0.7 | 45 | 40 |
| ex. 703 | 1.5 | 50 | 43 |
| ex. 704 | 3.1 | 48 | 46 |
| ex. 705 | 5 | 46 | 28 |
| ex. 706 | 12 | 41 | 17 |
| ex. 707 | 18 | 37 | 12 |
| ex. 708 | 25 | exfoliated/chipped | exfoliated/chipped |

TABLE 9

| | diameter within 20 nm (nm) | cutting test A (minutes) | cutting test B (minutes) |
|---|---|---|---|
| ex. 801 | 0.5 | 15 | 18 |
| ex. 802 | 2 | 30 | 38 |
| ex. 803 | 4 | 45 | 41 |
| ex. 804 | 8 | 40 | 30 |
| ex. 805 | 15 | 39 | 23 |
| ex. 806 | 25 | 12 | 16 |

TABLE 10

| | cutting test A (minutes) | cutting test B (minutes) |
|---|---|---|
| ex. 901 | 49 | 43 |
| ex. 902 | 44 | 41 |
| ex. 903 | 50 | 46 |
| comp. ex. 901 | exfoliated/chipped | exfoliated/chipped |

In the above table, "amorphous" indicates that the adhesion layer has an amorphous state, and "amorphous+ultrafine particles" indicates that the adhesion layer is a phase of a mixture of an amorphous state and ultrafine particles. A parenthesized numerical value indicates ultrafine particles' average particle size (nm).

"Amorphous+fine particles" indicates that the adhesion layer is a phase of a mixture of an amorphous state and fine particles. A parenthesized numerical value indicates fine particles' average particle size (nm).

As is apparent from Tables 1-10, it has been confirmed that the examples of the present invention obviously provide tools having longer lifetime than the comparative examples. That is, it has been confirmed that the present surface-coated sintered body allows excellent adhesion between the sintered body of cubic boron nitride and the surface coating layer and is excellent in both wear resistance and toughness.

While the present invention has been described in embodiments and examples, as above, it is also planned from the outset to combine each embodiment and example in configuration, as appropriate.

Although the present invention has been described and illustrated in detail, it should be understood that the disclosed embodiments and examples are by way of illustration and example in any regard and not to be taken by way of limitation. The scope of the present invention is indicated by the claimed scope and intended to encompass any variation equivalent in meaning and scope to the appended claims.

The invention claimed is:

1. A surface-coated sintered body, comprising:
a sintered body of cubic boron nitride and a surface coating layer formed on a surface thereof,
said sintered body of cubic boron nitride including 20-99.5% by volume of cubic boron nitride and a binder,
said surface coating layer including an adhesion layer and at least one hard coating layer,
said adhesion layer being a metal layer including at least W, and being formed to cover a surface of said sintered body of cubic boron nitride,
said hard coating layer being formed to coat said adhesion layer,
said adhesion layer being configured of an amorphous state and/or ultrafine particles having an average particle size equal to or smaller than 5 nm,
wherein said adhesion layer contains 0.1-20 atomic % of at least one type of element selected from a group consisting of Co, Ni and Fe.

2. The surface-coated sintered body according to claim 1, wherein said adhesion layer includes at least one of Ti and Cr at an atomic ratio of 0.1-3 relative to W.

3. The surface-coated sintered body according to claim 1, wherein said adhesion layer has a thickness of 1-30 nm.

4. The surface-coated sintered body according to claim 1, wherein said hard coating layer has a stress of −1.5 to +0.5 GPa.

5. The surface-coated sintered body according to claim 1, wherein:
said hard coating layer includes a first coating layer as a bottommost layer in contact with said sintered body of cubic boron nitride and said adhesion layer; and
said first coating layer is configured of a compound formed of: at least one type of element selected from a group consisting of a group IVa element, a group Va element and a group VIa element of the periodic table, Al, and Si; and at least one type of element selected from a group consisting of boron, carbon, nitrogen, and oxygen.

6. The surface-coated sintered body according to claim 5, wherein said first coating layer is configured of: at least one type of compound selected from a group consisting of TiAlN, AlCrN and TiSiCN, or a solid solution including said compound; or a super-multilayer structure having said compound or said solid solution as a constituent layer.

7. The surface-coated sintered body according to claim 5, wherein said first coating layer has a region within 20 nm from its interface with said adhesion layer, that is configured of a columnar crystal having a particle size of 1-20 nm.

8. The surface-coated sintered body according to claim 1, wherein said hard coating layer has a thickness of 0.5-20 μm.

9. A cutting tool having a substrate of cemented carbide with a cutting edge having the surface-coated sintered body of claim 1 bonded thereto.

10. The cutting tool according to claim 9, wherein:
said substrate is formed of cemented carbide; and
said cemented carbide includes at least WC and at least one type selected from a group consisting of Co, Ni and Fe.

* * * * *